(12) United States Patent
Lin et al.

(10) Patent No.: US 11,239,413 B2
(45) Date of Patent: Feb. 1, 2022

(54) MAGNETIC DEVICE AND MAGNETIC RANDOM ACCESS MEMORY

(71) Applicant: TAIWAN SEMICONDUCTOR MANUFACTURING CO., LTD., Hsinchu (TW)

(72) Inventors: Shy-Jay Lin, Jhudong Township (TW); Mingyuan Song, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/426,589

(22) Filed: May 30, 2019

(65) Prior Publication Data

US 2020/0136022 A1  Apr. 30, 2020

Related U.S. Application Data

(60) Provisional application No. 62/753,892, filed on Oct. 31, 2018.

(51) Int. Cl.
*H01L 43/04* (2006.01)
*H01L 27/22* (2006.01)
*H01L 43/14* (2006.01)
*H01L 43/10* (2006.01)
*H01L 43/06* (2006.01)

(52) U.S. Cl.
CPC ............ *H01L 43/04* (2013.01); *H01L 27/228* (2013.01); *H01L 43/06* (2013.01); *H01L 43/10* (2013.01); *H01L 43/14* (2013.01)

(58) Field of Classification Search
None
See application file for complete search history.

(56) References Cited

U.S. PATENT DOCUMENTS

| | | | |
|---|---|---|---|
| 2006/0102970 A1 | 5/2006 | Butcher et al. | |
| 2007/0111332 A1* | 5/2007 | Zhao | H01F 10/3254 438/3 |
| 2010/0109109 A1* | 5/2010 | Chen | H01L 43/08 257/421 |
| 2014/0153324 A1 | 6/2014 | Yu | |

(Continued)

FOREIGN PATENT DOCUMENTS

| KR | 20070084328 A | 8/2007 |
|---|---|---|
| KR | 20140071215 A | 6/2014 |
| KR | 10-2018-0089847 A | 8/2018 |

OTHER PUBLICATIONS

S. Fukami et al., "Magnetization switching by spin-orbit torque in an antiferromagnet/ferromagnet bilayer system." Preprint at <http://arxiv.org/abs/1507.00888> (2015).

(Continued)

*Primary Examiner* — Benjamin P Sandvik
(74) *Attorney, Agent, or Firm* — McDermott Will & Emery LLP

(57) ABSTRACT

A spin-orbit-torque (SOT) magnetic device includes a bottom metal layer, a first magnetic layer, as a magnetic free layer, disposed over the bottom metal layer, a spacer layer disposed over the first magnetic layer, and a second magnetic layer disposed over the spacer layer. The first magnetic layer includes a lower magnetic layer, a middle layer made of non-magnetic layer and an upper magnetic layer.

20 Claims, 12 Drawing Sheets

(56) References Cited

U.S. PATENT DOCUMENTS

| | | | | |
|---|---|---|---|---|
| 2016/0155485 | A1* | 6/2016 | Dieny | H01L 43/08 |
| | | | | 365/158 |
| 2016/0300999 | A1* | 10/2016 | Yi | G11C 11/1675 |
| 2017/0076769 | A1* | 3/2017 | Shirotori | H01L 43/02 |
| 2017/0352701 | A1 | 12/2017 | Gan et al. | |
| 2018/0114557 | A1* | 4/2018 | Park | G11C 11/1659 |
| 2018/0190419 | A1* | 7/2018 | Swerts | H01F 41/325 |
| 2018/0219152 | A1* | 8/2018 | Apalkov | H01F 10/3286 |
| 2019/0006414 | A1* | 1/2019 | Huai | G11C 11/161 |
| 2019/0355897 | A1* | 11/2019 | Sun | H01F 10/3272 |
| 2020/0006630 | A1* | 1/2020 | Sato | H01L 43/12 |

OTHER PUBLICATIONS

Yong-Chang Lau et al., "Spin-orbit torque switching without external field with a ferromagnetic exchange-biased coupling layer," <https://arxiv.org/abs/1511.05773>, arXiv:1511.05773v1 [cond-mat.mes-hall] Nov. 18, 2015.

Young-Wan Oh et al., "Field-Free Switching of Perpendicular Magnetization through Spin-orbit Torque in Antiferromagnet/ferromagnet/oxide Structures," Nat. Nanotechnol. (2016).

A. Van Den Brink et al., "Field-free magnetization reversal by spin-Hall effect and exchange bias," Nature Communications, 6 pages (Mar. 4, 2016).

G. Yu et al., "Switching of perpendicular magnetization by spin-orbit torques in the absence of external magnetic fields," https://arxiv.org/ftp/arxiv/papers/1311/1311 0929.pdf (2014).

W. Zhang et al., "Giant facet-dependent spin-orbit torque and spin Hall conductivity in the triangular antiferromagnet IrMn3," Sci. Adv., 2, e1600759 (2016).

Z. Zhao et al., "External-Field-Free Spin Hall Switching of Perpendicular Magnetic Nanopillar with a Dipole-Coupled Composit Structure," https://arxiv.org/ftp/arxiv/papers/1603/1603.09624.pdf (2016).

* cited by examiner

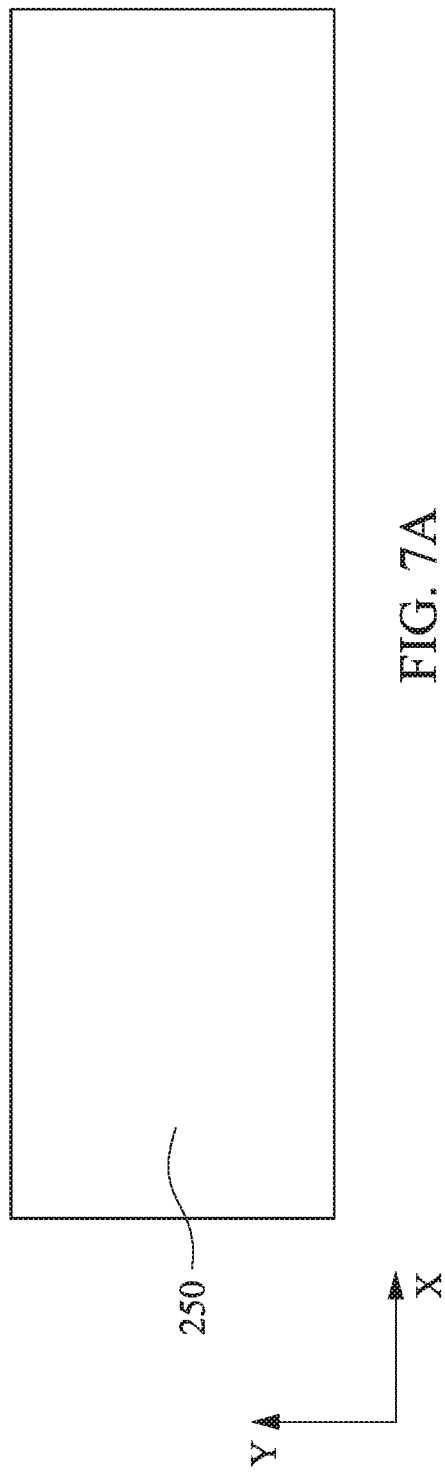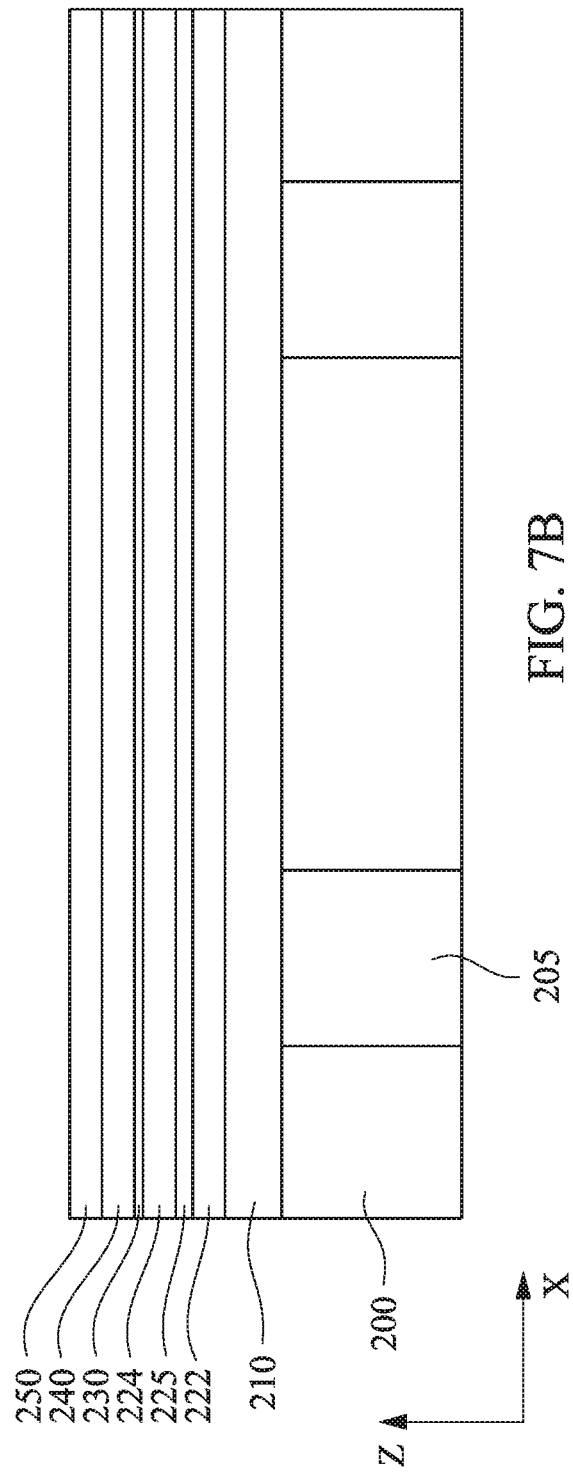

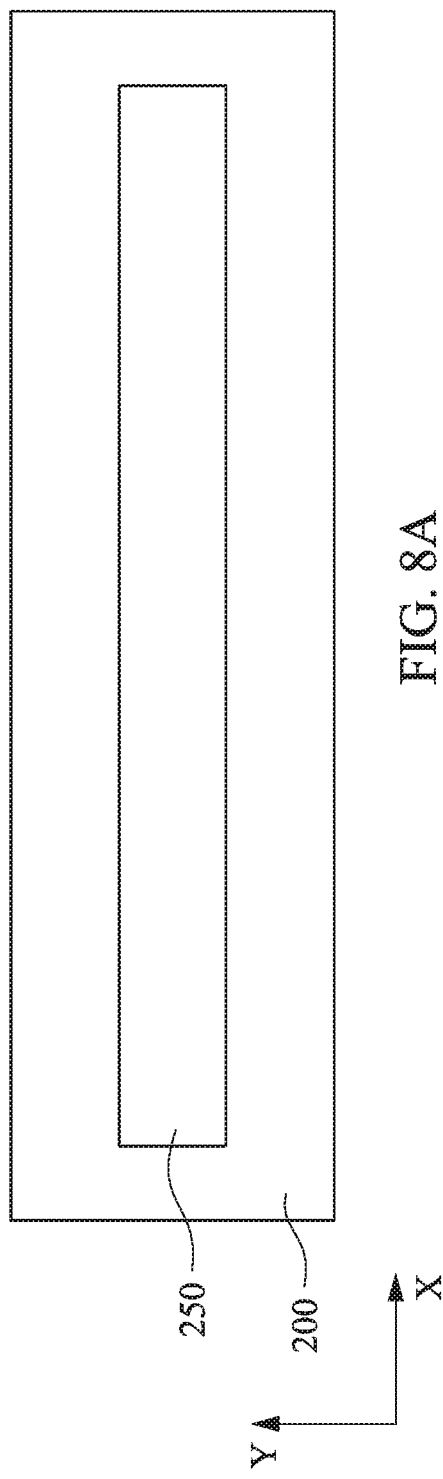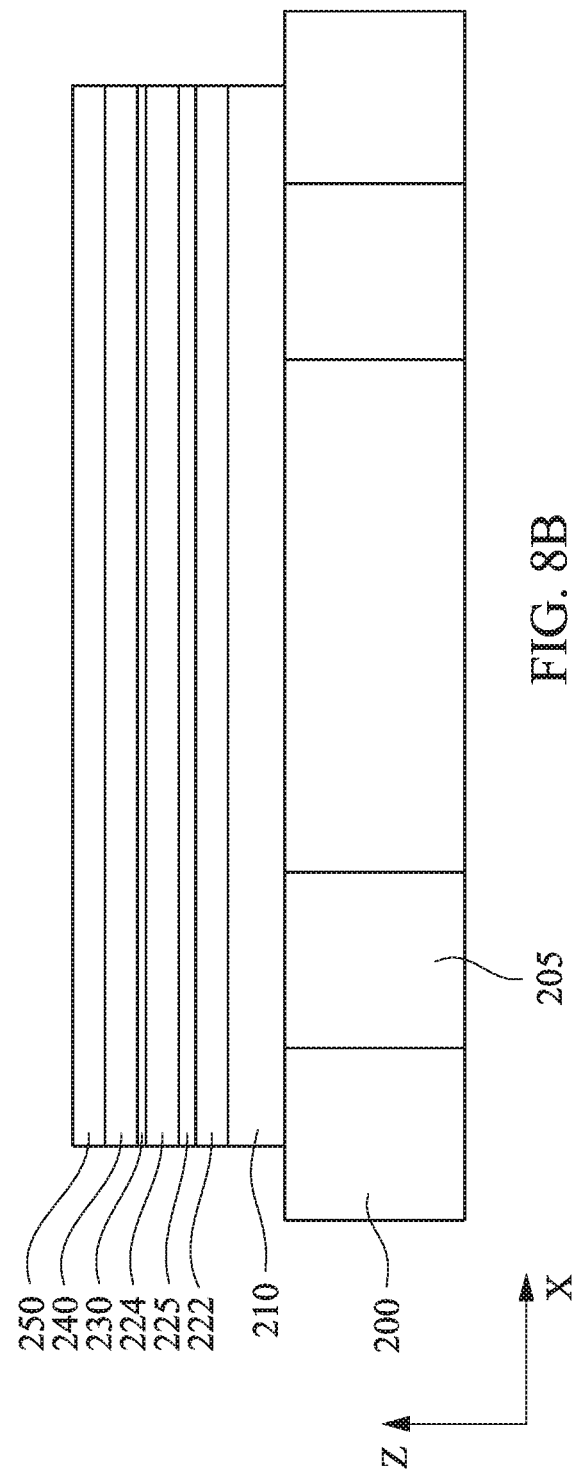

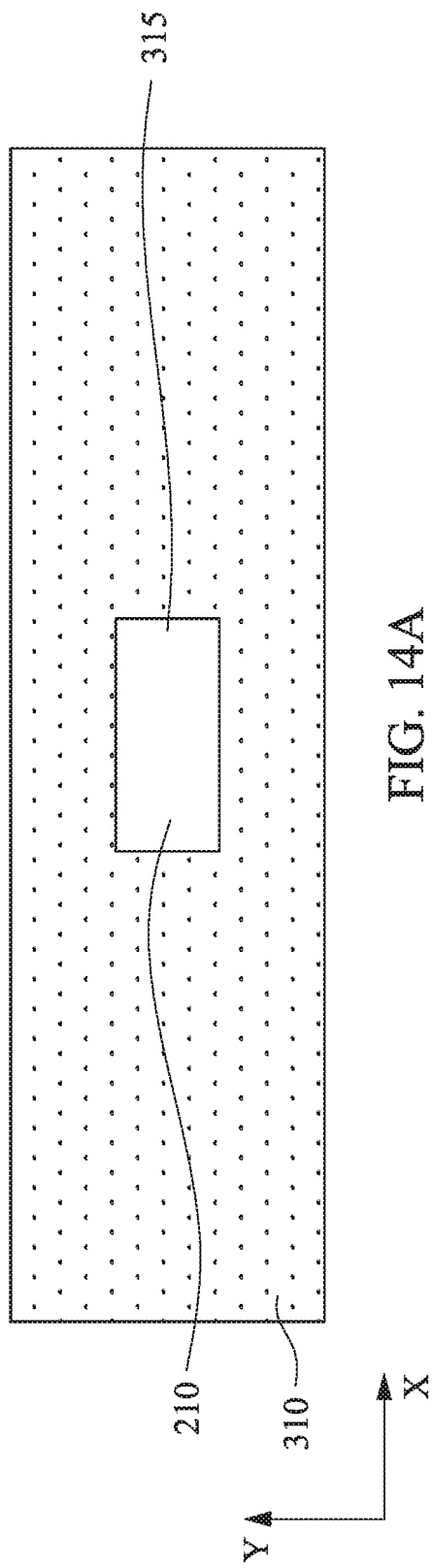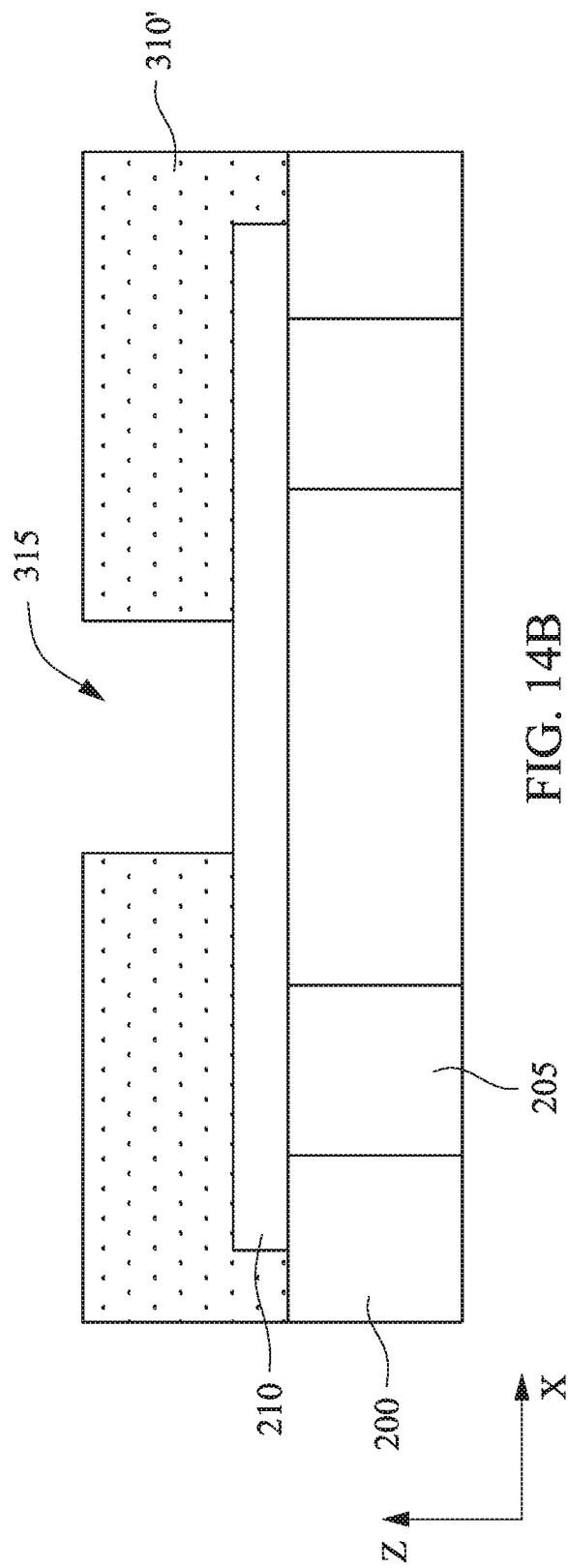

MAGNETIC DEVICE AND MAGNETIC RANDOM ACCESS MEMORY

RELATED APPLICATIONS

This application claims priority of U.S. Provisional Patent Application No. 62/753,892 filed Oct. 31, 2018, of which disclosure is incorporated herein by reference.

BACKGROUND

An MRAM offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. One type of an MRAM is a spin transfer torque random access memory (STT-RAM). An STT-RAM utilizes a magnetic tunneling junction (MTJ) written at least in part by a current driven through the MTJ. Another type of an MRAM is a spin orbit torque RAM (SOT-RAM).

BRIEF DESCRIPTION OF THE DRAWINGS

FIGS. 7A and 7B show one of the various stages of a sequential manufacturing operation of a SOT MRAM according to an embodiment of the present disclosure.

FIGS. 8A and 8B show one of the various stages of a sequential manufacturing operation of a SOT MRAM according to an embodiment of the present disclosure.

FIGS. 14A and 14B show one of the various stages of a sequential manufacturing operation of a SOT MRAM according to another embodiment of the present disclosure.

DETAILED DESCRIPTION

Figure 2:
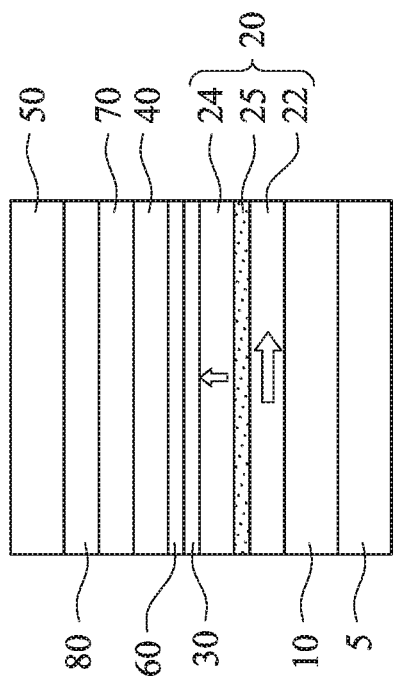
FIG. 2 is a schematic cross sectional view of a SOT MRAM cell according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

An STT MRAM has features, such as non-volatile nature, compatibility with Si-CMOS technology, fast read and write speed, high endurance and retention of data, a relatively small bit-cell size and environmental robustness, and thus is the next disruptive technology for all CMOS integrated circuits (ICs) that require memory. A high-value emerging application for a STT MRAM is a low-level cache for a central processing unit (CPU) or a microcontroller unit (MCU), which offers the attractive benefit of system speed boost and faster turn-on due its non-volatility. However, this application puts a strenuous requirement on the memory's speed, more specifically on write speed which is much slower than read speed. The cache application for an MCU additionally requires low-power consumption, which is hard for a STT MRAM, because it takes substantial current to change the magnetization state during the write operation. In current STT MRAM art, write speed improvement via a film stack and write scheme optimization and write current reduction via stack optimization and CD reduction may be stalled due to inevitable performance trade-off in endurance and retention. Novel ideas, like a high frequency-assisted write operation, have been proposed, which may not be feasible. There is a significant gap between the best reported STT MRAM write speed and current and those required by cache applications, which could amount to a show stopper.

In contrast, spin-orbital-transfer (or torque) (SOT) magnetic switching is an emerging write concept that has the potential to provide an order-of-magnitude improvement on write current and speed. SOT is considered as a solution for high-speed, low power cache application.

However, current SOT devices may have some issues, such as thermal stability of perpendicular magnetic anisotropy (PMA). The perpendicular magnetic anisotropy is affected by an interface between a spin orbit active layer (e.g., a heavy metal layer) and a free magnetic layer (e.g., a data storage layer). In particular, interfacial diffusion may degrade the perpendicular magnetic anisotropy performance. Defects and non-ideal structure of the interface may result in perpendicular magnetic anisotropy instability and a thicker magnetic dead layer (MDL), at which ferromagnetic order is lost.

The present disclosure is directed to a novel interface between the spin orbit active layer and the free magnetic layer to solve the aforementioned problems in the SOT magnetic device.

Figure 1:
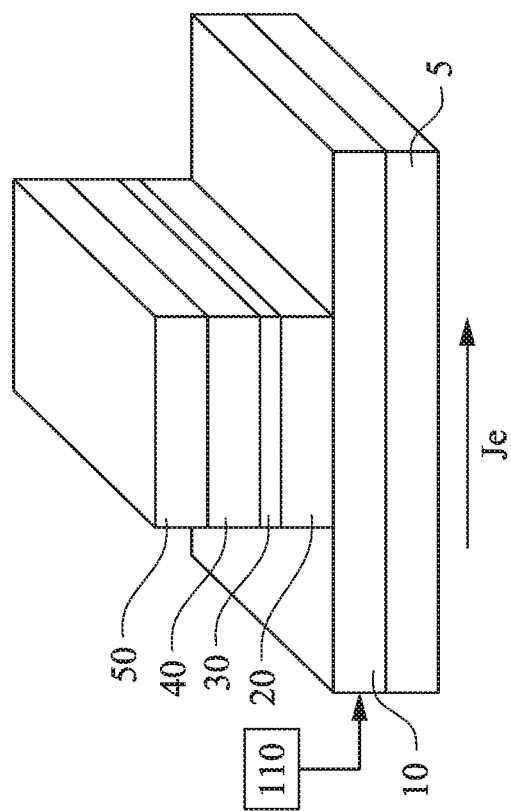
FIG. 1 is a schematic view of a SOT MRAM cell according to an embodiment of the present disclosure.

FIG. 1 is a schematic view of a SOT MRAM cell (SOT magnetic device) that utilizes spin-orbit interaction in switching according to an embodiment of the present disclosure.

The SOT magnetic device includes a bottom metal layer 10, as a spin-orbit interaction active layer, formed over a support layer 5. Further, the SOT magnetic device includes a first magnetic layer 20, which is a free magnetic layer or a data storage layer, disposed over the bottom metal layer 10, a nonmagnetic spacer layer 30 disposed over the first magnetic layer, and a second magnetic layer 40, as a reference layer, disposed over the nonmagnetic spacer layer 30. In some embodiments, a top conductive layer 50, as an electrode, is disposed over the second magnetic layer 40.

The magnetic moment of the free layer 20 (first magnetic layer) is switched using the spin-orbit interaction effect. In some embodiments, the magnetic moment of the first magnetic layer 20 is switched using only the spin-orbit interaction effect. In other embodiments, the magnetic moment of the first magnetic layer 20 is switched using a combination of effects. For example, the magnetic moment of the first magnetic layer 20 is switched using spin transfer torque as a primary effect that may be assisted by torque induced by the spin-orbit interaction. In other embodiments, the primary switching mechanism is torque induced by the spin-orbit interaction. In such embodiments, another effect including, but not limited to, spin transfer torque, may assist in switching.

The bottom metal layer 10 is a spin orbit active layer that has a strong spin-orbit interaction and that can be used in switching the magnetic moment of the first magnetic layer 20. The bottom metal layer 10 is used in generating a spin-orbit magnetic field H. More specifically, a current driven in a plane through the bottom metal layer 10 and the attendant spin-orbit interaction may result in the spin-orbit magnetic field H. This spin orbit magnetic field H is equivalent to the spin-orbit torque T on magnetization, where $T=-\gamma[M \times H]$ in the first magnetic layer 20. The torque and magnetic field are thus interchangeably referred to as spin-orbit field and spin-orbit torque. This reflects the fact that the spin-orbit interaction is the origin of the spin-orbit torque and spin-orbit field. Spin-orbit torque occurs for a current driven in a plane in the bottom metal layer 10 and a spin-orbit interaction. In contrast, spin transfer torque is due to a perpendicular-to-plane current flowing through the first magnetic layer 20, the nonmagnetic spacer layer 30 and the second magnetic layer 40 (reference layer), that injects spin polarized charge carriers into the first magnetic layer 20. The spin-orbit torque T may rapidly deflect the magnetic moment of the first magnetic layer 20 from its equilibrium state parallel to the easy axis. The spin-orbit torque T may tilt the magnetization of the first magnetic layer 20 considerably faster than conventional STT torque of a similar maximum amplitude. In some embodiments, switching can be completed using spin-orbit torque. In other embodiments, another mechanism such as spin transfer may be used to complete switching. The spin-orbit field/spin-orbit torque generated may thus be used in switching the magnetic moment of the first magnetic layer 20.

In some embodiments, the interaction of the bottom metal layer includes the spin Hall effect. For the spin Hall effect, a current Je is driven in the plane of the bottom metal layer 10 (i.e., current-in-plane, substantially in the x-y plane in FIG. 1). In other words, the current Je is driven perpendicular to the stacked direction of the films including the bottom metal layer 10 and the first magnetic layer 20 (i.e., perpendicular to the normal to the surface, the z-direction in FIG. 1). Charge carriers having spins of a particular orientation perpendicular to the direction of current and to the normal to the surface (z-direction) accumulate at the surfaces of the bottom metal layer 10. A majority of these spin-polarized carriers diffuse into the first magnetic layer 20 (free layer). This diffusion results in the torque T on the magnetization of the first magnetic layer 20. Since torque on the magnetization is equivalent to the effective magnetic field on the magnetization, as set forth above, the spin accumulation equivalently results in the field H on the first magnetic layer 20. The spin-orbit field for the spin-Hall effect is the cross product of the spin-orbit polarization and the magnetic moment of the first magnetic layer 20. As such, the magnitude of the torque is proportional to in the plane current density Je and spin polarization of the carriers. The spin-Hall effect may be used in switching the magnetic stacked layer shown in FIG. 1 when the polarization induced by the spin-Hall effect is parallel to the easy axis of the first magnetic layer 20. To obtain the spin-orbit torque T, the current pulse is driven in plane through the bottom metal layer 10. The resulting spin-orbit torque T counteracts damping torque, which results in the switching of the magnetization of the first magnetic layer 20 in an analogous manner to conventional STT switching.

As set forth above, the bottom metal layer 10 is a spin orbit active layer that causes a strong spin orbit interaction with the first magnetic layer 20 (free layer). In some embodiments, the bottom metal layer 10 includes one or more heavy metals or materials doped by heavy metals. In certain embodiments, α-W, β-W, Pt, Mo, Ru and/or β-Ta is used as the bottom metal layer 10. A thickness of the bottom metal layer 10 is in a range from about 2 nm to 20 nm in some embodiments and is in a range from about 5 nm to 15 nm in other embodiments. In some embodiments, an antiferromagnetic layer made of, for example, IrMn, is disposed between the bottom metal layer 10 and the support layer 5. In other embodiments, instead of the heavy metal layer, the antiferromagnetic layer is used as the bottom metal layer 10.

The first magnetic layer 20 as a data storage layer is a free layer having a magnetic moment that is switchable. In some embodiments, the first magnetic layer 20 includes a lower magnetic layer 22, a middle layer 25 and an upper magnetic layer 24 as shown in FIG. 2. In some embodiments, the lower magnetic layer 22 is a cobalt iron boron (CoFeB) layer, a cobalt/palladium (CoPd) layer and/or a cobalt iron (CoFe) layer, having a thickness in a range from about 0.6 nm to about 1.2 nm in some embodiments. In certain embodiments, the lower magnetic layer 22 is $Fe_xCo_yBi_{1-x-y}$, where $0.50 \leq x \leq 0.70$ and $0.10 \leq y \leq 0.30$. In other embodiments, $0.55 \leq x \leq 0.65$ and $0.15 \leq y \leq 0.25$.

In some embodiments, the upper magnetic layer 24 is a cobalt iron boron (CoFeB) layer, a cobalt/palladium (CoPd) layer and/or a cobalt iron (CoFe) layer, having a thickness in a range from about 1.0 nm to about 3.0 nm, or a NiFe layer having a thickness in a range from about 0.4 nm to about 3.0 nm in some embodiments. In certain embodiments, the upper magnetic layer 24 is $Fe_xCo_yBi_{1-x-y}$, where $0.50 \leq x \leq 0.70$ and $0.10 \leq y \leq 0.30$. In other embodiments, $0.55 \leq x \leq 0.65$ and $0.15 \leq y \leq 0.25$. In some embodiments, the upper magnetic layer 22 is made of the same material as the lower magnetic layer 22. In other embodiments, the upper magnetic layer 22 is made of a different material than the lower magnetic layer 22.

The middle non-magnetic layer 25 is a coupling layer and made of one or more of W, Mo, Pt and Ru and alloy thereof, in some embodiments. The thickness of the middle non-magnetic layer 25 is in a range from about 0.2 nm to about 0.5 nm in some embodiments. Through the coupling material of the middle non-magnetic layer 25, the lower magnetic layer 22 and the upper magnetic layer 24 of the first magnetic layer 20 are coupled. Such a coupling would break the symmetry and hence field free switching is possible. As shown in FIG. 2, the direction of magnetic field of the lower magnetic layer 22 is substantially horizontal (perpendicular to the film stack direction), while the direction of magnetic field of the upper magnetic layer 24 is substantially vertical (parallel to the film stack direction), in some embodiments. In some embodiments, the magnetic field direction of, for example, the lower magnetic layer 22, may tilt at a small angle (e.g., 1 to 30 degrees), which may cause a degradation on a TMR ratio. In some embodiments, the TMR ratio can be optimized by controlling the thickness of at least one of the lower magnetic layer 22 and the upper magnetic layer 24.

Figure 3:
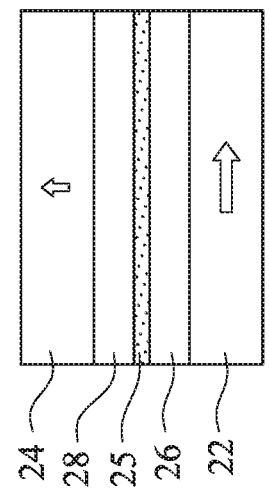
FIG. 3 is a schematic cross sectional view of a SOT MRAM cell according to an embodiment of the present disclosure.

In some embodiments, as shown in FIG. 3, interfacial layers 26 and 28 are disposed between the lower magnetic layer 22 and the middle non-magnetic layer 25 and between the middle non-magnetic layer 25 and the upper magnetic layer 24, respectively. In some embodiments, the interfacial layers 26 and 28 are made of FeB. The thickness of the interfacial layers 26 and 28 is in a range from about 0.5 nm to about 2.0 nm in some embodiments. When the middle non-magnetic layer 25 is disposed between the lower magnetic layer 22 and the upper magnetic layer 24 (in other words, the middle non-magnetic layer 25 is inserted in the first magnetic layer 20), a dead layer may be observed at the interface between the middle non-magnetic layer 25 and the lower magnetic layer 22 and/or the upper magnetic layer 24, which may weaken perpendicular magnetic anisotropy (PMA). By inserting the interfacial layers 26 and 28, it is possible to suppress the dead layer, and can maintain or improve the PMA.

The nonmagnetic spacer layer 30 is made of a dielectric material, and functions as a tunneling barrier. In some embodiments, the nonmagnetic spacer layer 30 includes a crystalline or an amorphous magnesium oxide (MgO) layer. In other embodiments, the nonmagnetic spacer layer 30 is made of aluminum oxide or a conductive material, such as Cu. In some embodiments, the nonmagnetic spacer layer 30 has a thickness in a range from about 0.3 nm to about 1.2 nm, and in other embodiments, the thickness of the non-magnetic layer 30 is in a range from about 0.5 nm to about 1.0 nm. In this disclosure, an "element layer" or a "compound layer" generally means that the content of the element or compound is more than 99%.

The second magnetic layer 40 is a reference layer of which the magnetic moment does not change. In some embodiments, the second magnetic layer 40 is made of the same material as the first magnetic layer 20 as set forth above. In some embodiments, the second magnetic layer 40 includes multiple layers of magnetic materials. In some embodiments, the second magnetic layer 40 includes a multilayer structure of cobalt (Co) and platinum (Pt). In some embodiments, a thickness of the second magnetic layer 40 is in a range from about 0.2 nm to about 1.0 nm and is in a range from about 0.3 nm to about 0.5 nm in other embodiments.

In some embodiments, the second magnetic layer 40 is a multilayer including a synthetic antiferromagnetic layer having ferromagnetic layers separated by nonmagnetic layer, such as Ru. In some embodiments, a pinning layer, such as an antiferromagnetic layer that fixes the magnetic moment of the second magnetic layer 40 in place is disposed over the second magnetic layer 40 with a Ru layer interposed therebetween. The first and second magnetic layers are crystalline in some embodiments.

The top conductive layer 50 as an electrode includes one or more layers of Ta, Ru, Au, Cr and Pt.

The support layer 5 is made of a dielectric material, such as silicon oxide, silicon oxynitride, silicon nitride, aluminum oxide, magnesium oxide or any other suitable material. In some embodiments, the support layer 5 is a shallow trench isolation layer, an interlayer dielectric (ILD) layer or an inter-metal dielectric (IMD) layer in a semiconductor device.

Further, as shown in FIG. 2, in some embodiments, an intermediate metal layer 60 is disposed between the non-magnetic spacer layer 30 and the second magnetic layer 40. In some embodiments, the intermediate metal layer 60 is made of a nonmagnetic material. In certain embodiments, the intermediate metal layer 60 is made of Mg. A thickness of the intermediate metal layer 60 is in a range from about 0.1 nm to about 0.6 nm in some embodiments and is in a range from about 0.2 nm to about 0.5 nm in other embodiments. In other embodiments, no intermediate metal layer is used.

In some embodiments, an antiferromagnetic layer 70 is formed over the second magnetic layer, and a third magnetic layer 80 is formed over the antiferromagnetic layer 70, as shown in FIG. 2. The anti-ferromagnetic layer 70 helps to fix the magnetic moment of the second magnetic layer 40. In some embodiments, the antiferromagnetic layer 70 includes ruthenium (Ru) or any other suitable antiferromagnetic material. In some embodiments, the thickness of the anti-ferromagnetic layer 70 is in a range from about 0.2 nm to about 0.8 nm.

The third magnetic layer 80 includes one or more layers of magnetic materials. In some embodiments, the third magnetic layer 80 includes one or more of cobalt, iron, nickel and platinum. In some embodiments, the material of the third magnetic layer 80 is the same as or different from the material of the second magnetic layer 40. In certain embodiments, the third magnetic layer 80 is a CoPt layer. A thickness of the third magnetic layer is in a range from about 0.5 nm to about 1.5 nm in some embodiments and is in a range from about 0.7 nm to about 1.2 nm in other embodiments.

Each of the layers shown in FIGS. 1-3 can be formed by suitable film formation methods, which include physical vapor deposition (PVD) including sputtering; molecular beam epitaxy (MBE); pulsed laser deposition (PLD); atomic layer deposition (ALD); electron beam (e-beam) epitaxy; chemical vapor deposition (CVD); or derivative CVD processes further includeing low pressure CVD (LPCVD), ultrahigh vacuum CVD (UHVCVD), reduced pressure CVD (RPCVD); electro plating, or any combinations thereof.

In some embodiments, a film stack is formed by the aforementioned film formation operations, and after the film stacks are formed, a patterning operation including one or more lithography and etching operations is performed on the film stack to form a SOT cell as shown in FIG. 1.

In some embodiments, a bottom metal layer 10 is formed over a support layer 5. The bottom metal layer 10 can be formed by PVD, CVD, ALD or any other suitable film formation methods. Then, a first magnetic layer 20 is formed by using PVD, CVD, ALD or any other suitable film formation methods. As set forth above, the first magnetic layer 20 includes the lower magnetic layer 22, the middle non-magnetic layer 25 and the upper magnetic layer 24. In some embodiments, the first magnetic layer 20 further includes the interfacial layers 26 and 28. These layers are sequentially formed over the bottom metal layer 10. Further, the remaining layers are sequentially formed over the first magnetic layer 20.

Figure 4:
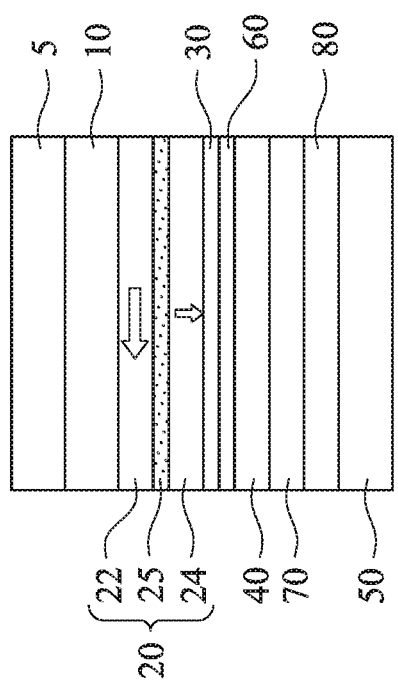
FIG. 4 is a schematic cross sectional view of a SOT MRAM cell according to an embodiment of the present disclosure.

FIG. 4 is a schematic cross sectional view of a SOT MRAM cell according to an embodiment of the present disclosure. In this embodiments, the order of the stacked films are reversed.

Figure 5:
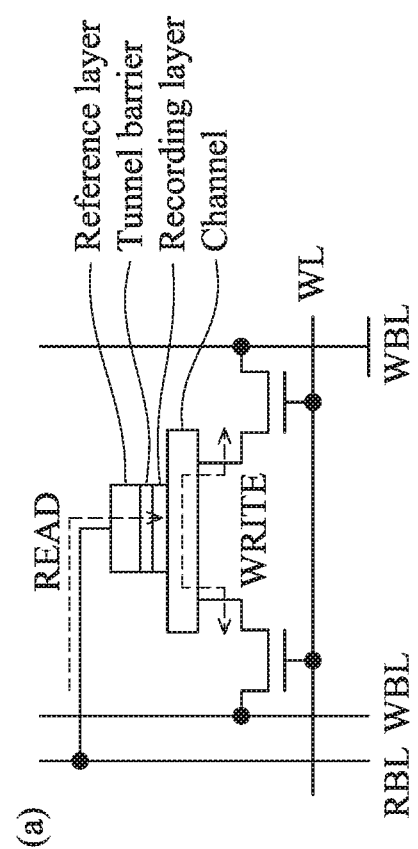
FIG. 5 is a circuit diagram of a SOT MRAM according to an embodiment of the present disclosure.

FIG. 5 is a circuit diagram of a SOT MRAM according to an embodiment of the present disclosure. A write current flows from a write bit line (WBL) to a complimentary write bit line, or vice versa, through one or more switches (MOS transistors). The WBLs are coupled to a current source 110 (see, FIG. 1). The write current causes a vertical magnetic field, which may change the direction of magnetic field of the first magnetic layer 20 (free layer). The upper electrode is coupled to a read bit line (RBL) to read the data in the SOT MRAM. Generally, no vertical current passing through the SOT MRAM stack is applied from outside the SOT MRAM.

FIGS. 6A to 12 show various stages of a sequential manufacturing operation of a SOT MRAM according to an embodiment of the present disclosure. It is understood that additional operations can be provided before, during, and after the processes shown by FIGS. 6A-12, and some of the operations described below can be replaced or eliminated, for additional embodiments of the method. The order of the operations/processes may be interchangeable. Materials, configurations, dimensions, processes and/or operations the same as or similar to those described with respect to the foregoing embodiments may be employed in the following embodiments and the detailed explanation may be omitted. FIGS. 6A, 7A, 8A and 9A are plan views (top views) and FIGS. 6B, 7B, 8B and 9B are cross sectional views.

Figure 6A:
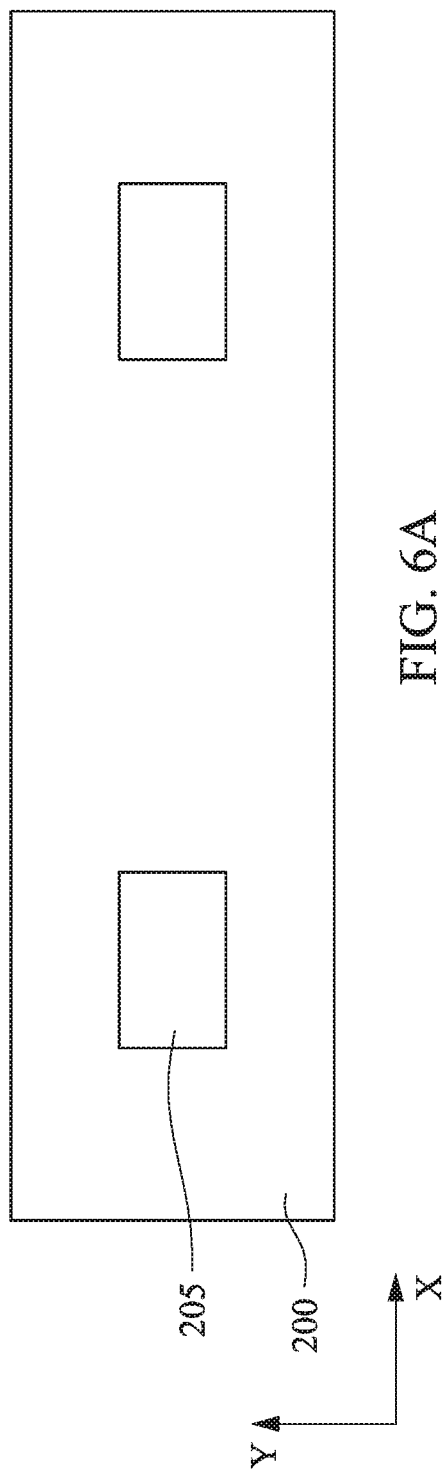
FIGS. 6A and 6B show one of the various stages of a sequential manufacturing operation of a SOT MRAM according to an embodiment of the present disclosure.
Figure 6B:
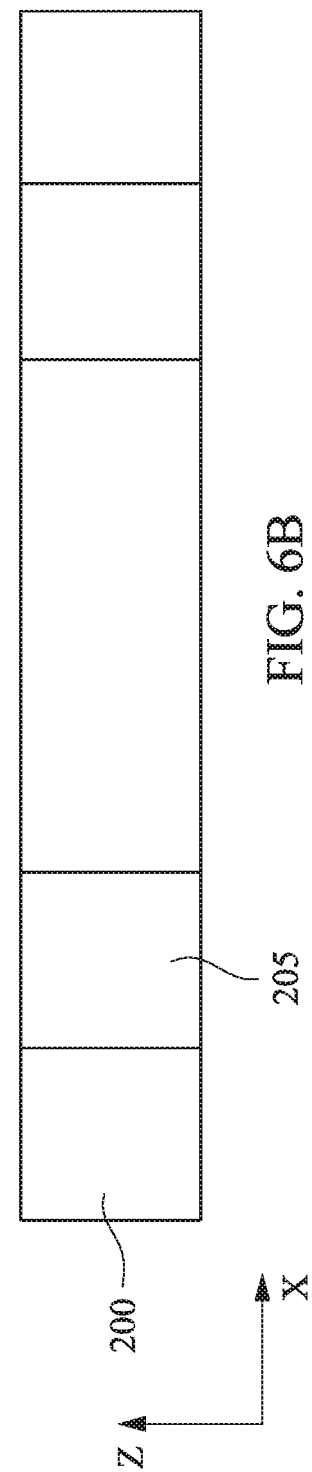

As shown in FIGS. 6A and 6B, bottom via contacts 205 are formed in a first ILD layer 200. The first ILD layer 200 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the first ILD layer 200 is formed through a process such as CVD, flowable CVD (FCVD), or a spin-on-glass process, although any acceptable process may be utilized. Subsequently, a planarization process, such as chemical mechanical polishing (CMP) and/or an etch-back process, or the like is performed.

The bottom via contacts 205 are formed in contact with the lower metal wiring (not shown) and pass through the first ILD layer 200 in some embodiments. In some embodiments, the bottom via contact 205 includes a liner layer and a body layer. The liner layer includes one or more layers of Ti, TiN, Ta or TaN, or other suitable material, and the body layer includes one or more layers of W, Cu, Al, Mo, Co, Pt, Ni, and/or an alloy thereof or other suitable material, in some embodiments. A damascene technique is used to form the bottom via contact 205 in some embodiments. In some embodiments, the bottom via contact 205 is coupled to bit lines via switching transistors, respectively.

Then, as shown in FIGS. 7A and 7B, a stacked layer is formed. The stacked layer includes, in the named order or the reverse order, a bottom metal layer 210 corresponding to the bottom metal layer 10 of the foregoing embodiments, a lower magnetic layer 222 corresponding to the lower magnetic layer 22 of the foregoing embodiments, a middle non-magnetic layer 225 corresponding to the middle non-magnetic layer 225 of the foregoing embodiments, an upper magnetic layer 224 corresponding to the upper magnetic layer 24 of the foregoing embodiments, a nonmagnetic spacer layer 230 corresponding to the nonmagnetic spacer layer 30 of the foregoing embodiments, a second magnetic layer 240 corresponding to the second magnetic layer 40 of the foregoing embodiments, and a top conductive layer 250 corresponding to the top conductive layer 50 of the foregoing embodiments. In some embodiments, layers corresponding to the interfacial layers 26 and 28, the intermediate metal layer 60, the antiferromagnetic layer 70 and/or the third magnetic layer 80 are included in the stacked layer. Each of the layers can be formed by suitable film formation methods, which include physical vapor deposition (PVD) including sputtering; molecular beam epitaxy (MBE); pulsed laser deposition (PLD); atomic layer deposition (ALD); electron beam (e-beam) epitaxy; chemical vapor deposition (CVD); or derivative CVD processes further comprising low pressure CVD (LPCVD), ultrahigh vacuum CVD (UHVCVD), reduced pressure CVD (RPCVD); electro plating, or any combinations thereof.

By using one or more lithography and etching operations, the stacked layer is patterned into a line pattern in some embodiments, as shown in FIGS. 8A and 8B. The width of the line pattern is in a range from about 10 nm to about 50 nm in some embodiments, and is in a range from about 15 nm to about 30 nm in other embodiments in the Y direction.

Figure 9A:
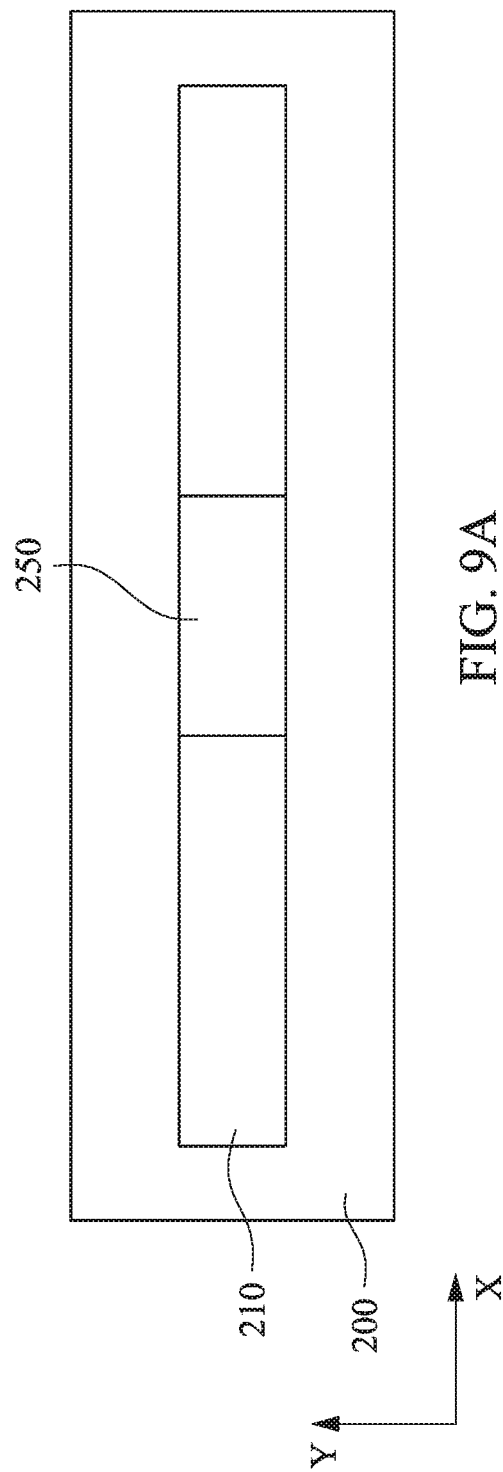
FIGS. 9A and 9B show one of the various stages of a sequential manufacturing operation of a SOT MRAM according to an embodiment of the present disclosure.
Figure 9B:
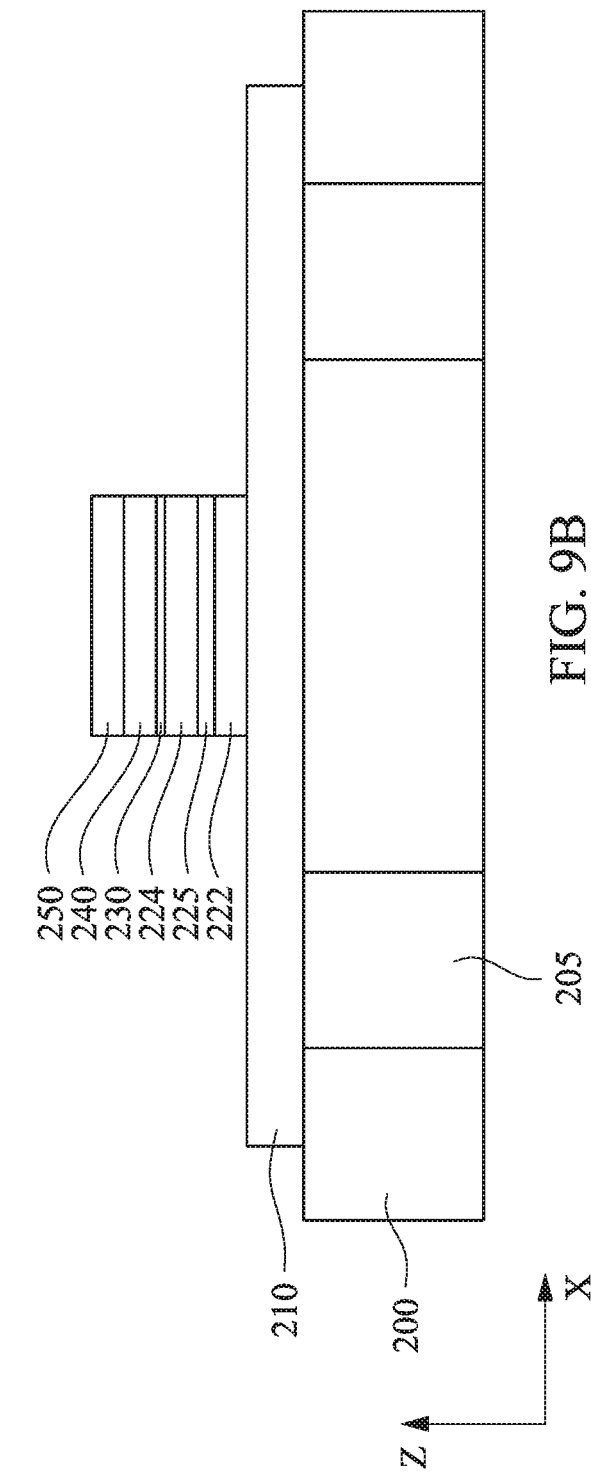

Further, as shown in FIGS. 9A and 9B, by using one or more lithography and etching operations, the lower magnetic layer 222, the middle non-magnetic layer 225, the upper magnetic layer 224, the nonmagnetic spacer layer 230, the second magnetic layer 240 and the top conductive layer 250 are patterned to form a SOT film stack. The etching operation is performed to selectively remove the lower magnetic layer 222 against the bottom metal layer 210. In some embodiments, an oxidation operation is performed to adjust resistivity of the SOT film stack. The width of the patterned film stack is in a range from about 10 nm to about 50 nm in some embodiments, and is in a range from about 15 nm to about 30 nm in other embodiments in the X direction. As shown in FIGS. 9A and 9B, the dimension of the film stack along the X direction is smaller than the dimension of the bottom metal layer 210 in some embodiments.

Figure 10:
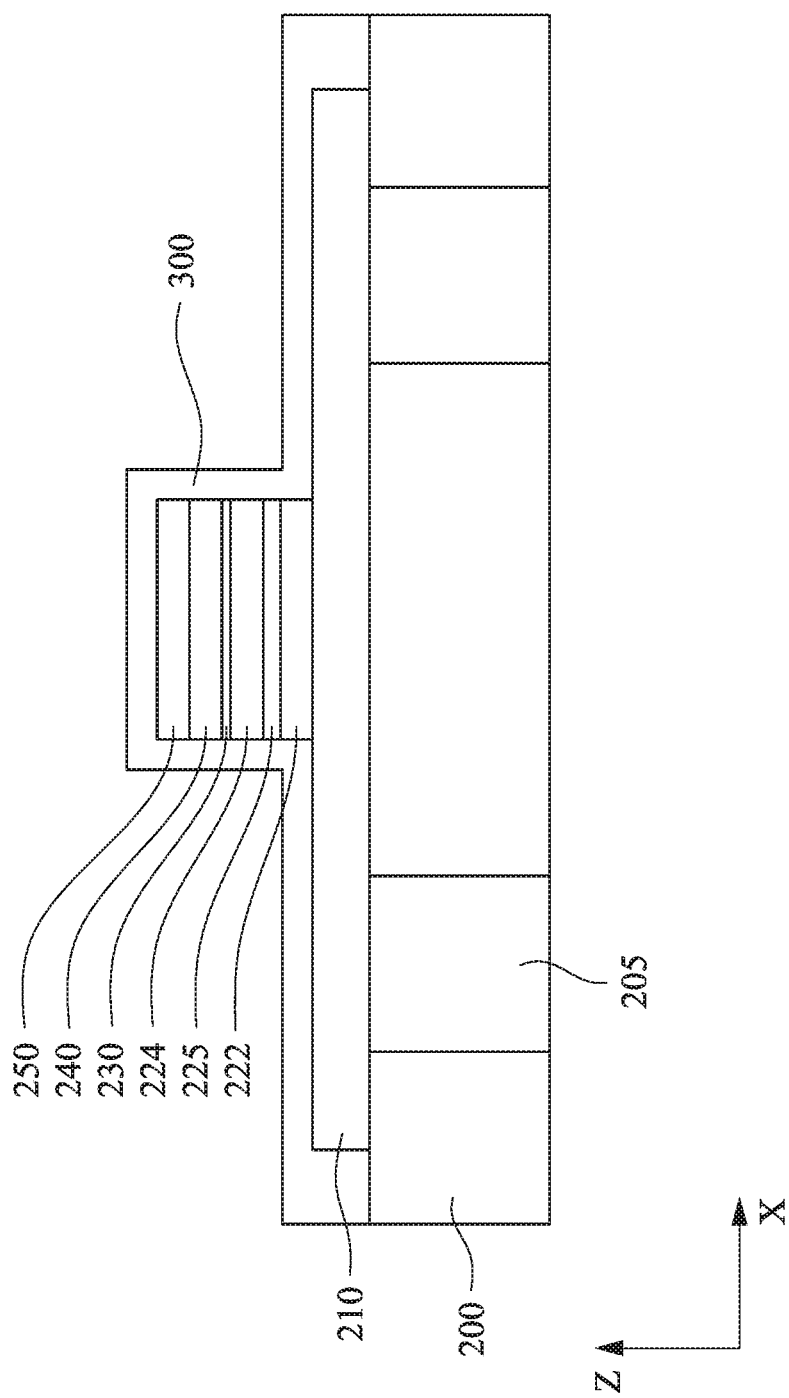
FIG. 10 shows one of the various stages of a sequential manufacturing operation of a SOT MRAM according to an embodiment of the present disclosure.

Subsequently, as shown in FIG. 10, one or more insulating cover layers 300 are formed to cover the patterned stacked layer. One of the insulating cover layers 300 includes a SiON layer, a SiCN layer or a SiOCN layer in some embodiments. One of the insulating cover layers 300 includes a zirconium-based insulating material, such as zirconium nitride (ZrN), zirconium carbide (ZrC) and zirconium diboride (ZrB$_2$) in some embodiments. One of the insulating cover layers 300 includes a SiC layer in some embodiments. When a SiC layer is used, the SiC layer is a topmost layer of the insulating cover layer in some embodiments.

Figure 11:
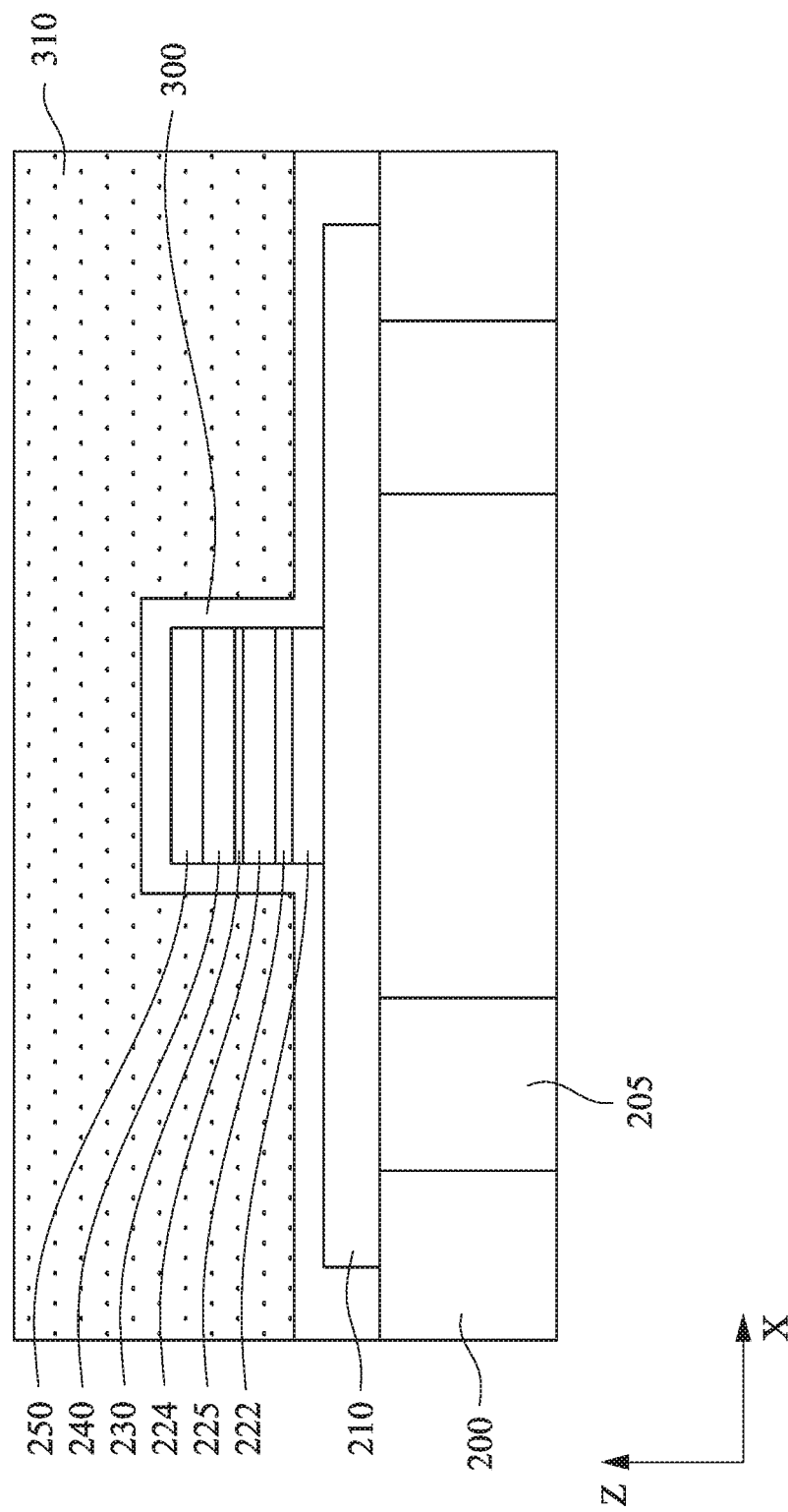
FIG. 11 shows one of the various stages of a sequential manufacturing operation of a SOT MRAM according to an embodiment of the present disclosure.

Further, as shown in FIG. 11, a second ILD layer 310 is formed over the insulating cover layer 300. The second ILD layer 310 is made of one or more layers of dielectric material, and has the same or similar configuration as the first ILD layer 200, in some embodiments.

Figure 12:
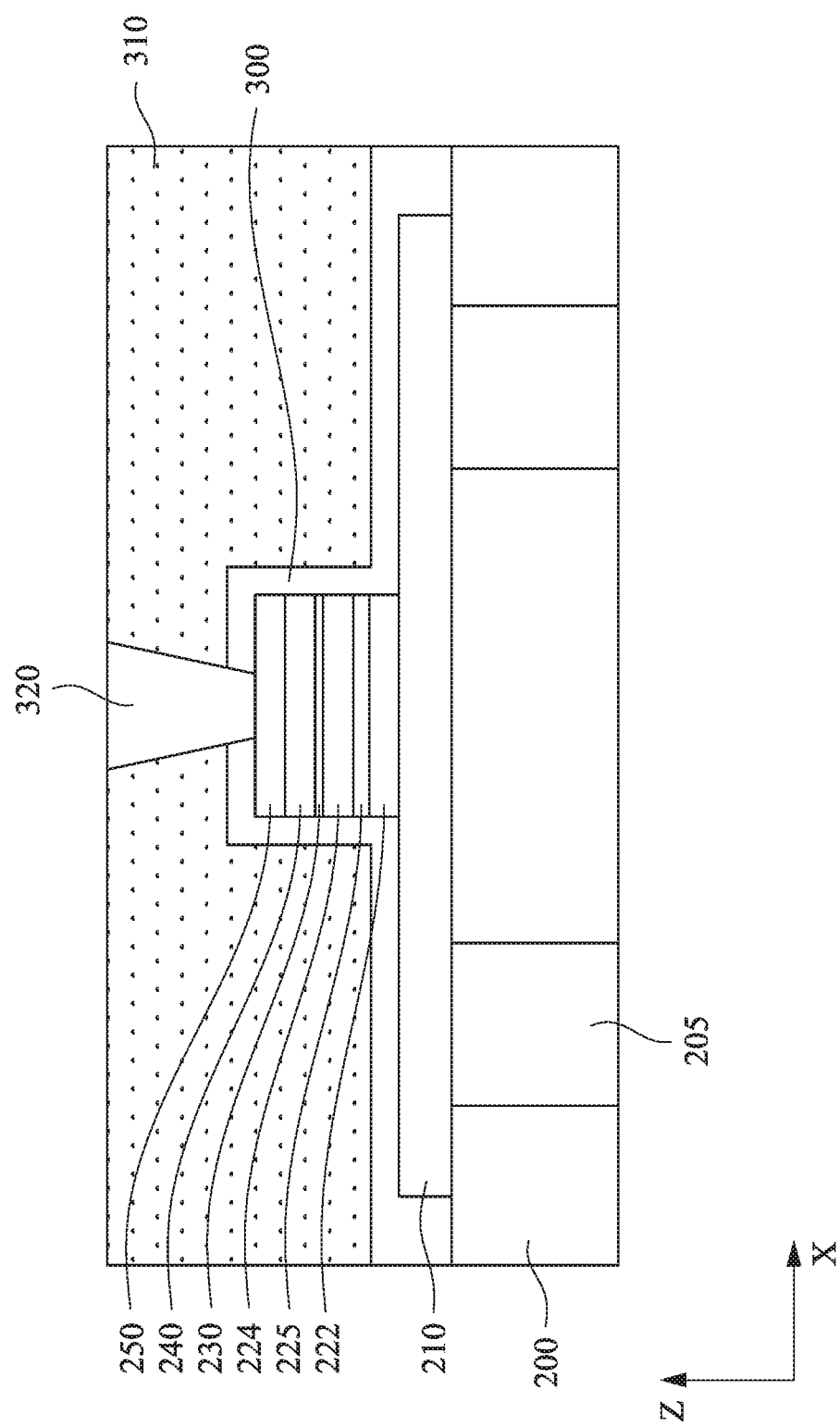
FIG. 12 shows one of the various stages of a sequential manufacturing operation of a SOT MRAM according to an embodiment of the present disclosure.

Then, as shown in FIG. 12, the second ILD layer and the insulating cover layer 300 are patterned by one or more lithography and etching operations, to form a contact opening, and the contact opening is filled with a conductive material to form an upper via contact 320.

It is understood that the device shown in FIG. 12 undergoes further semiconductor processes to form various features such as interconnect metal layers, dielectric layers, passivation layers, etc.

Figure 13A:
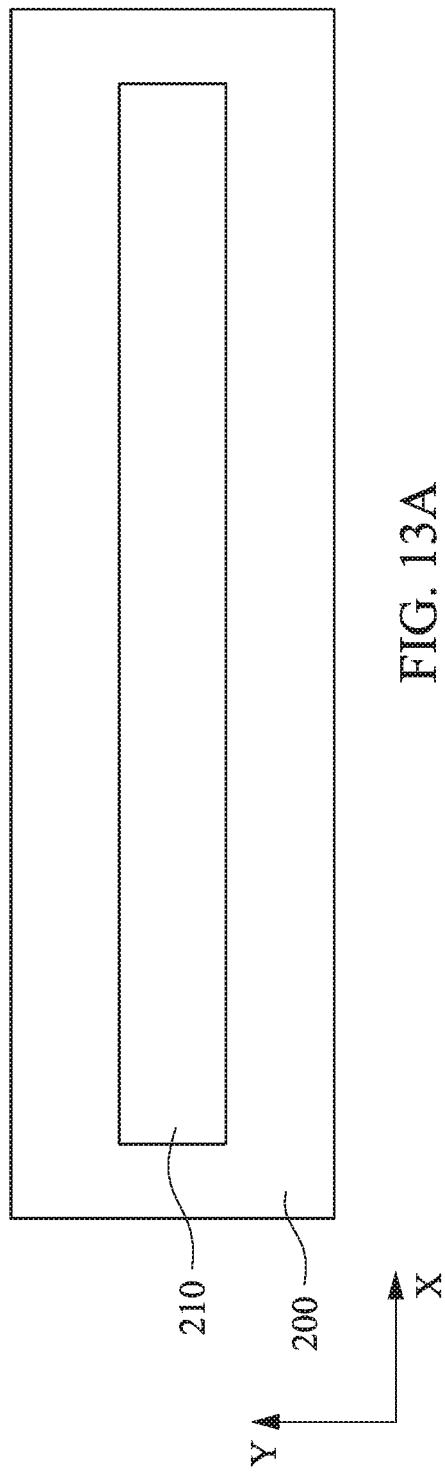
FIGS. 13A and 13B show one of the various stages of a sequential manufacturing operation of a SOT MRAM according to another embodiment of the present disclosure.
Figure 13B:
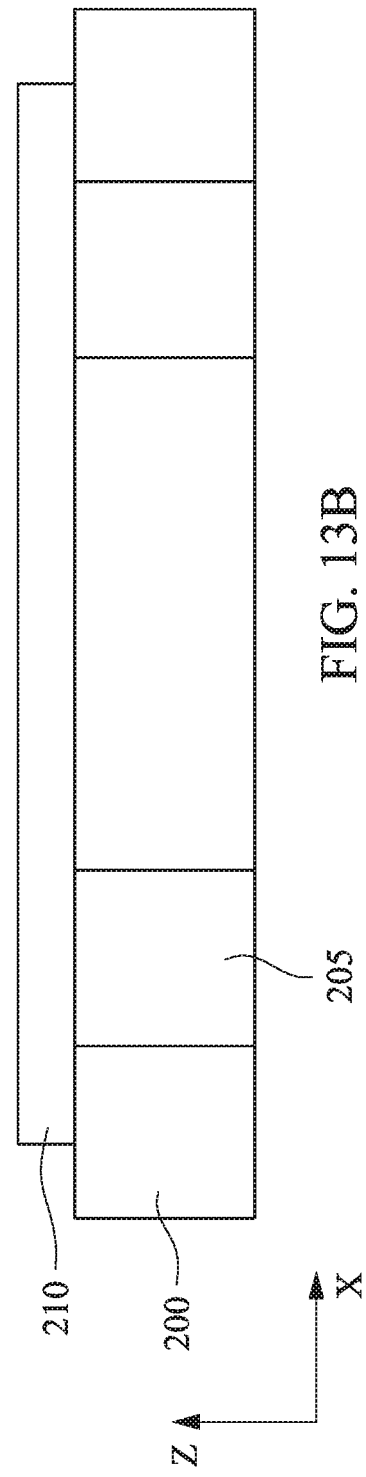
Figure 15A:
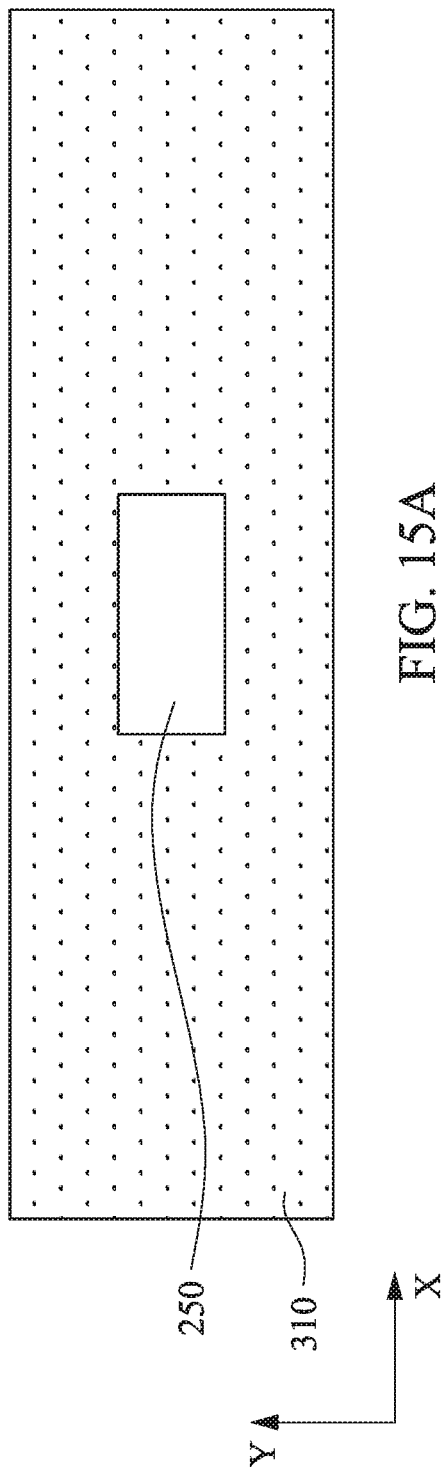
FIGS. 15A and 15B show one of the various stages of a sequential manufacturing operation of a SOT MRAM according to another embodiment of the present disclosure.
Figure 15B:
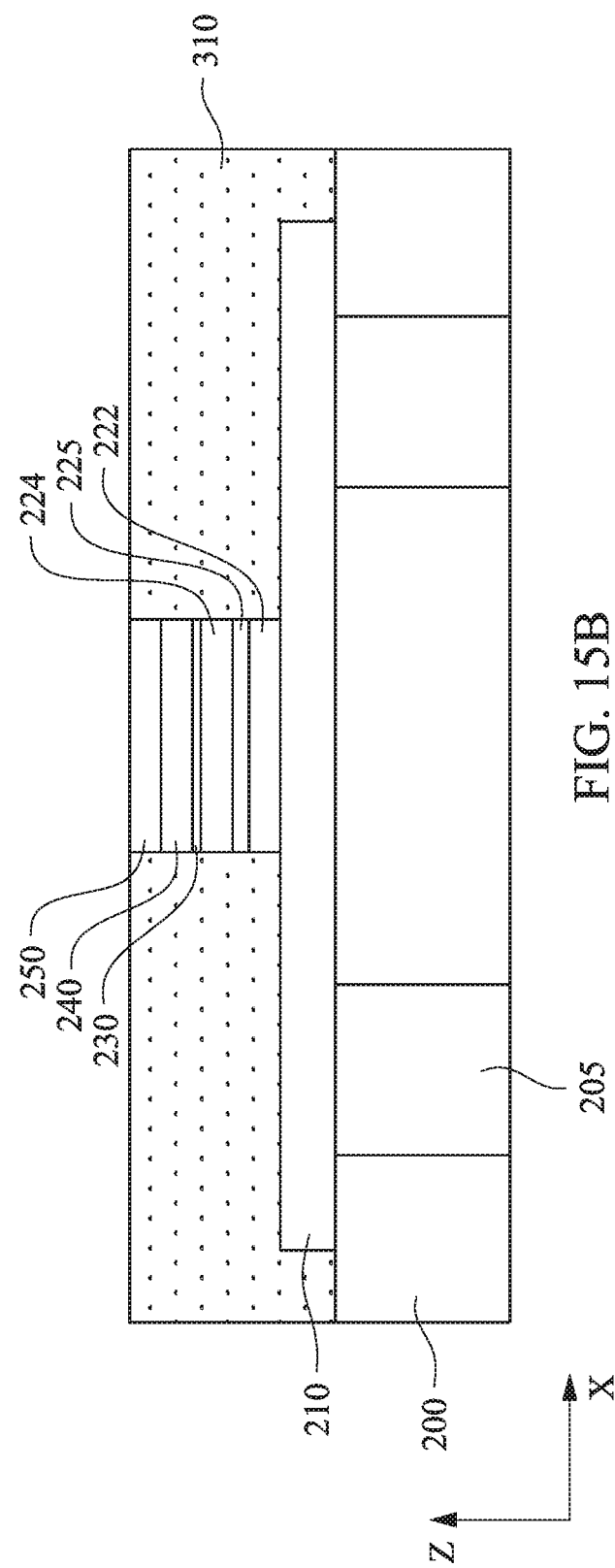

FIGS. 13A to 15B show various stages of a sequential manufacturing operation of a SOT MRAM according to another embodiment of the present disclosure. It is understood that additional operations can be provided before, during, and after the processes shown by FIGS. 13A-15B, and some of the operations described below can be replaced or eliminated, for additional embodiments of the method. The order of the operations/processes may be interchangeable. Materials, configurations, dimensions, processes and/or operations the same as or similar to those described with respect to the foregoing embodiments may be employed in the following embodiments and the detailed explanation may be omitted. FIGS. 13A, 14A and 15A are plan views (top views) and FIGS. 13B, 14B and 15B are cross sectional views.

As shown in FIG. 13A, a bottom metal layer 210 is formed by depositing metallic material over the bottom via contact 205 and the first ILD layer 200 and one or more lithography and etching operations.

Then, an ILD layer 310' is formed over the patterned bottom metal layer 210, and by using one or more lithography and etching operations, an opening 315 is formed in the ILD layer 301' as shown in FIGS. 14A and 14B.

Subsequently, as shown in FIGS. 15A and 15B, a stacked layer including, in the named order or the reverse order, a lower magnetic layer 222, a middle non-magnetic layer 225, an upper magnetic layer 224, a nonmagnetic spacer layer 230, a second magnetic layer 240, and a top conductive layer 250 is formed. In some embodiments, layers corresponding to the interfacial layers 26 and 28, the intermediate metal layer 60, the antiferromagnetic layer 70 and/or the third magnetic layer 80 are included in the stacked layer. Each of the layers can be formed by suitable film formation methods, which include molecular beam epitaxy (MBE) and atomic layer deposition (ALD) or any other suitable film deposition methods.

In some embodiments, one or more additional ILD layers are formed over the ILD layer 310 and an upper via contact is formed to contact the top conductive layer 250.

It is understood that the device shown in FIGS. 15A and 15B undergoes further semiconductor processes to form various features such as interconnect metal layers, dielectric layers, passivation layers, etc.

In the present disclosure, in a SOT MRAM device, a middle layer 25 as a coupling layer inserted between a lower free magnetic layer 22 and an upper free magnetic layer 24, breaks the symmetry and make field free switching possible.

It will be understood that not all advantages have been necessarily discussed herein, no particular advantage is required for all embodiments or examples, and other embodiments or examples may offer different advantages.

In accordance with one aspect of the present disclosure, a spin-orbit-torque (SOT) magnetic device includes a bottom metal layer, a first magnetic layer, as a magnetic free layer, disposed over the bottom metal layer, a spacer layer disposed over the first magnetic layer, and a second magnetic layer disposed over the spacer layer. The first magnetic layer includes a lower magnetic layer, a middle layer made of non-magnetic layer and an upper magnetic layer. In one or more of the foregoing or the following embodiments, the lower magnetic layer includes an alloy of iron, cobalt and boron. In one or more of the foregoing or the following embodiments, the upper magnetic layer includes at least one of an alloy of iron, cobalt and boron and an alloy of nickel and iron. In one or more of the foregoing or the following embodiments, a thickness of the lower magnetic layer is in a range from 0.6 nm to 1.2 nm. In one or more of the foregoing or the following embodiments, the upper magnetic layer includes the alloy of iron, cobalt and boron, and a thickness of the alloy of iron, cobalt and boron is in a range from 1.0 nm to 3.0 nm. In one or more of the foregoing or the following embodiments, the upper magnetic layer includes the alloy of nickel and iron, and a thickness of the alloy of nickel and iron is in a range from 0.4 nm to 3.0 nm. In one or more of the foregoing or the following embodiments, the lower magnetic layer is $Fe_xCo_yBi_{1-x-y}$, $0.50 \leq x \leq 0.70$ and $0.10 \leq y \leq 0.30$. In one or more of the foregoing or the following embodiments, the middle non-magnetic layer includes one or more layers of W, Mo, Pt and Ru, and alloy thereof. In one or more of the foregoing or the following embodiments, a thickness of the middle non-magnetic layer in a range from 0.2 nm to 0.5 nm. In one or more of the foregoing or the following embodiments, the bottom metal layer is made of tungsten, molybdenum or tantalum. In one or more of the foregoing or the following embodiments, the SOT magnetic device further includes an intermediate metal layer disposed between the spacer layer and the second magnetic layer. In one or more of the foregoing or the following embodiments, the intermediate metal layer is made of magnesium and the spacer layer is made of magnesium oxide. In one or more of the foregoing or the following embodiments, the SOT magnetic device further includes a top metal layer disposed over the second magnetic layer. In one or more of the foregoing or the following embodiments, the top metal layer is made of ruthenium. In one or more of the foregoing or the following embodiments, the second magnetic layer includes iron, cobalt and boron. In one or more of the foregoing or the following embodiments, the first magnetic layer includes a first interfacial layer between the lower magnetic layer and the middle layer and a second interfacial layer between the middle non-magnetic layer and the upper magnetic layer. In one or more of the foregoing or the following embodiments, at least one of the first and second interfacial layer is made of FeB. In one or more of the foregoing or the following embodiments, at least one of the first and second interfacial layer has a thickness in a range from 0.5 nm to 2.0 nm.

In accordance with another aspect of the present disclosure, a spin-orbit-torque (SOT) magnetic device includes a bottom metal layer, a first magnetic layer, as a free magnetic layer, disposed under the bottom metal layer, a spacer layer disposed under the first magnetic layer, and a second magnetic layer disposed under the spacer layer. The first magnetic layer includes a lower magnetic layer, a middle layer made of non-magnetic layer and an upper magnetic layer. In one or more of the foregoing or the following embodiments, the lower magnetic layer includes an alloy of iron, cobalt and boron. In one or more of the foregoing or the following embodiments, the upper magnetic layer includes at least one of an alloy of iron, cobalt and boron and an alloy of nickel and iron. In one or more of the foregoing or the following embodiments, a thickness of the lower magnetic layer is in a range from 0.6 nm to 1.2 nm. In one or more of the foregoing or the following embodiments, the upper magnetic layer includes the alloy of iron, cobalt and boron, and a thickness of the alloy of iron, cobalt and boron is in a range from 1.0 nm to 3.0 nm. In one or more of the foregoing or the following embodiments, the upper magnetic layer includes the alloy of nickel and iron, and a thickness of the alloy of nickel and iron is in a range from 0.4 nm to 3.0 nm. In one or more of the foregoing or the following embodiments, the lower magnetic layer is $Fe_xCo_yBi_{1-x-y}$, $0.50 \le x \le 0.70$ and $0.10 \le y \le 0.30$. In one or more of the foregoing or the following embodiments, the middle non-magnetic layer includes one or more layers of W, Mo, Pt and Ru, and alloy thereof. In one or more of the foregoing or the following embodiments, a thickness of the middle non-magnetic layer in a range from 0.2 nm to 0.5 nm. In one or more of the foregoing or the following embodiments, the bottom metal layer is made of tungsten, molybdenum or tantalum. In one or more of the foregoing or the following embodiments, the SOT magnetic device further includes an intermediate metal layer disposed between the spacer layer and the second magnetic layer. In one or more of the foregoing or the following embodiments, the intermediate metal layer is made of magnesium and the spacer layer is made of magnesium oxide. In one or more of the foregoing or the following embodiments, the SOT magnetic device further includes a top metal layer disposed over the second magnetic layer. In one or more of the foregoing or the following embodiments, the top metal layer is made of ruthenium. In one or more of the foregoing or the following embodiments, the second magnetic layer includes iron, cobalt and boron. In one or more of the foregoing or the following embodiments, the first magnetic layer includes a first interfacial layer between the lower magnetic layer and the middle layer and a second interfacial layer between the middle non-magnetic layer and the upper magnetic layer. In one or more of the foregoing or the following embodiments, at least one of the first and second interfacial layer is made of FeB. In one or more of the foregoing or the following embodiments, at least one of the first and second interfacial layer has a thickness in a range from 0.5 nm to 2.0 nm.

In accordance with another aspect of the present disclosure, a magnetic memory includes a spin-orbit-torque (SOT) magnetic device and a switching device. The SOT magnetic device includes a bottom metal layer, a first magnetic layer, as a free magnetic layer, disposed over the bottom metal layer, a spacer layer disposed over the first magnetic layer, and a second magnetic layer disposed over the spacer layer. The switching device is coupled to the bottom metal layer and a current source. The first magnetic layer includes a lower magnetic layer, a middle layer made of non-magnetic layer and an upper magnetic layer. In one or more of the foregoing or the following embodiments, the lower magnetic layer includes an alloy of iron, cobalt and boron. In one or more of the foregoing or the following embodiments, the upper magnetic layer includes at least one of an alloy of iron, cobalt and boron and an alloy of nickel and iron. In one or more of the foregoing or the following embodiments, a thickness of the lower magnetic layer is in a range from 0.6 nm to 1.2 nm. In one or more of the foregoing or the following embodiments, the upper magnetic layer includes the alloy of iron, cobalt and boron, and a thickness of the alloy of iron, cobalt and boron is in a range from 1.0 nm to 3.0 nm. In one or more of the foregoing or the following embodiments, the upper magnetic layer includes the alloy of nickel and iron, and a thickness of the alloy of nickel and iron is in a range from 0.4 nm to 3.0 nm. In one or more of the foregoing or the following embodiments, the lower magnetic layer is $Fe_xCo_yBi_{1-x-y}$, $0.50 \le x \le 0.70$ and $0.10 \le y \le 0.30$. In one or more of the foregoing or the following embodiments, the middle non-magnetic layer includes one or more layers of W, Mo, Pt and Ru, and alloy thereof. In one or more of the foregoing or the following embodiments, a thickness of the middle non-magnetic layer in a range from 0.2 nm to 0.5 nm. In one or more of the foregoing or the following embodiments, the bottom metal layer is made of tungsten, molybdenum or tantalum. In one or more of the foregoing or the following embodiments, the SOT magnetic device further includes an intermediate metal layer disposed between the spacer layer and the second magnetic layer. In one or more of the foregoing or the following embodiments, the intermediate metal layer is made of magnesium and the spacer layer is made of magnesium oxide. In one or more of the foregoing or the following embodiments, the SOT magnetic device further includes a top metal layer disposed over the second magnetic layer. In one or more of the foregoing or the following embodiments, the top metal layer is made of ruthenium. In one or more of the foregoing or the following embodiments, the second magnetic layer includes iron, cobalt and boron. In one or more of the foregoing or the following embodiments, the first magnetic layer includes a first interfacial layer between the lower magnetic layer and the middle layer and a second interfacial layer between the middle non-magnetic layer and the upper magnetic layer. In one or more of the foregoing or the following embodiments, at least one of the first and second interfacial layer is made of FeB. In one or more of the foregoing or the following embodiments, at least one of the first and second interfacial layer has a thickness in a range from 0.5 nm to 2.0 nm.

In accordance with another aspect of the present disclosure, in a method of manufacturing a spin-orbit-torque (SOT) magnetic device, bottom via contacts are formed in a first interlayer dielectric layer, a stacked layer including a bottom metal layer, a first magnetic layer, a spacer layer and a second magnetic layer is formed, the stacked layer is patterned to form a line pattern, and the first magnetic layer, the spacer layer and the second magnetic layer are patterned to form a SOT film stack. The first magnetic layer includes a lower magnetic layer, a middle layer made of non-magnetic layer and an upper magnetic layer. In one or more of the foregoing or the following embodiments, the lower magnetic layer includes an alloy of iron, cobalt and boron. In one or more of the foregoing or the following embodiments, a thickness of the lower magnetic layer is in a range from 0.6 nm to 1.2 nm. In one or more of the foregoing or the following embodiments, the upper magnetic layer includes the alloy of iron, cobalt and boron, and a thickness of the alloy of iron, cobalt and boron is in a range from 1.0 nm to 3.0 nm. In one or more of the foregoing or the following embodiments, the upper magnetic layer includes the alloy of nickel and iron, and a thickness of the alloy of nickel and iron is in a range from 0.4 nm to 3.0 nm. In one or more of the foregoing or the following embodiments, the lower magnetic layer is $Fe_xCo_yBi_{1-x-y}$, 0.50≤x≤0.70 and 0.10≤y≤0.30. In one or more of the foregoing or the following embodiments, the middle non-magnetic layer includes one or more layers of W, Mo, Pt and Ru, and alloy thereof. In one or more of the foregoing or the following embodiments, a thickness of the middle non-magnetic layer in a range from 0.2 nm to 0.5 nm. In one or more of the foregoing or the following embodiments, the bottom metal layer is made of tungsten, molybdenum or tantalum. In one or more of the foregoing or the following embodiments, the SOT magnetic device further includes an intermediate metal layer disposed between the spacer layer and the second magnetic layer. In one or more of the foregoing or the following embodiments, the intermediate metal layer is made of magnesium and the spacer layer is made of magnesium oxide. In one or more of the foregoing or the following embodiments, the SOT magnetic device further includes a top metal layer disposed over the second magnetic layer. In one or more of the foregoing or the following embodiments, the top metal layer is made of ruthenium. In one or more of the foregoing or the following embodiments, the second magnetic layer includes iron, cobalt and boron. In one or more of the foregoing or the following embodiments, the first magnetic layer includes a first interfacial layer between the lower magnetic layer and the middle layer and a second interfacial layer between the middle non-magnetic layer and the upper magnetic layer. In one or more of the foregoing or the following embodiments, at least one of the first and second interfacial layer is made of FeB. In one or more of the foregoing or the following embodiments, at least one of the first and second interfacial layer has a thickness in a range from 0.5 nm to 2.0 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A spin-orbit-torque (SOT) magnetic device, comprising:
   a bottom metal layer including a upper layer and a lower layer made of IrMn;
   a first magnetic layer, as a magnetic free layer, disposed over the bottom metal layer;
   a spacer layer disposed over the first magnetic layer;
   a second magnetic layer disposed over the spacer layer; and
   an intermediate metal layer disposed between the spacer layer and the second magnetic layer,
   wherein the first magnetic layer includes a lower magnetic layer, a middle layer made of non-magnetic layer, a first interfacial layer disposed between the lower magnetic layer and the middle layer, an upper magnetic layer and a second interfacial layer disposed between the middle layer and the upper magnetic layer,
   at least one of the first and second interfacial layers is made of FeB,
   the intermediate metal layer is a magnesium layer containing Mg more than 99%, and
   a direction of magnetic field of the lower magnetic layer is perpendicular to a film stack direction and a direction of magnetic field of the upper magnetic layer is parallel to the film stack direction.

2. The SOT magnetic device of claim 1, wherein the lower magnetic layer includes an alloy of iron, cobalt and boron.

3. The SOT magnetic device of claim 2, wherein:
   the upper magnetic layer includes at least one of an alloy of iron, cobalt and boron and an alloy of nickel and iron.

4. The SOT magnetic device of claim 3, wherein a thickness of the lower magnetic layer is in a range from 0.6 nm to 1.2 nm.

5. The SOT magnetic device of claim 3, wherein:
   the upper magnetic layer includes the alloy of iron, cobalt and boron, and
   a thickness of the alloy of iron, cobalt and boron is in a range from 1.0 nm to 3.0 nm.

6. The SOT magnetic device of claim 3, wherein:
   the upper magnetic layer includes the alloy of nickel and iron, and
   a thickness of the alloy of nickel and iron is in a range from 0.4 nm to 3.0 nm.

7. The SOT magnetic device of claim 3, wherein the lower magnetic layer is $Fe_xCo_yB_{1-x-y}$, where 0.50≤x≤0.70 and 0.10≤y≤0.30.

8. The SOT magnetic device of claim 1, wherein the middle non-magnetic layer includes one or more layers of W, Mo, Pt and Ru, and alloy thereof.

9. The SOT magnetic device of claim 8, wherein a thickness of the middle non-magnetic layer in a range from 0.2 nm to 0.5 nm.

10. The SOT magnetic device of claim 1, wherein the upper layer of the bottom metal layer is made of α-tungsten.

11. The SOT magnetic device of claim 1, wherein a thickness of the intermediate metal layer is in a range from 0.1 nm to 0.6 nm.

12. A spin-orbit-torque (SOT) magnetic device, comprising:
    a bottom metal layer;
    a first magnetic layer, as a free magnetic layer, disposed over the bottom metal layer;
    a spacer layer disposed over the first magnetic layer; and
    a second magnetic layer disposed over the spacer layer,
    wherein the first magnetic layer includes a lower magnetic layer, a middle layer made of non-magnetic layer, an upper magnetic layer, a first interfacial layer between the lower magnetic layer and the middle layer and a second interfacial layer between the middle layer and the upper magnetic layer, and
    at least one of the first and second interfacial layers is made of FeB.

13. The SOT magnetic device of claim 12, wherein at least one of the first and second interfacial layer has a thickness in a range from 0.5 nm to 2.0 nm.

14. A spin-orbit-torque (SOT) magnetic device, comprising:
- a bottom metal layer including an antiferromagnetic layer;
- a first magnetic layer, as a free magnetic layer, disposed under the bottom metal layer;
- a spacer layer disposed under the first magnetic layer; and
- a second magnetic layer disposed under the spacer layer,
- wherein the first magnetic layer includes a lower magnetic layer, a middle layer made of non-magnetic layer, a first interfacial layer disposed between the lower magnetic layer and the middle layer, an upper magnetic layer and a second interfacial layer disposed between the middle layer and the upper magnetic layer,
- at least one of the first and second interfacial layers is made of FeB,
- a direction of magnetic field of the lower magnetic layer is tilted by 70-89 degrees with respect to a film stack direction, and
- the lower magnetic layer is made of a different material than the upper magnetic layer.

15. The SOT magnetic device of claim 14, wherein:
- the lower magnetic layer includes an alloy of iron, cobalt and boron, and
- the upper magnetic layer includes an alloy of nickel and iron.

16. The SOT magnetic device of claim 14, wherein the bottom metal layer is a bi-layer of an IrMn layer and a heavy metal layer.

17. The SOT magnetic device of claim 14, wherein the second magnetic layer includes a multilayer including a synthetic antiferromagnetic layer having ferromagnetic layers separated by a nonmagnetic layer.

18. The SOT magnetic device of claim 14, further comprising an antiferromagnetic layer disposed over the second magnetic layer made of ruthenium (Ru).

19. The SOT magnetic device of claim 14, further comprising a third magnetic layer disposed over the antiferromagnetic layer, the third magnetic layer includes a CoPt layer.

20. The SOT magnetic device of claim 19, wherein a thickness of the third magnetic layer is in a range from 0.5 nm to 1.5 nm.

* * * * *